US012610827B2

(12) United States Patent
Chen et al.

(10) Patent No.: US 12,610,827 B2
(45) Date of Patent: Apr. 21, 2026

(54) SEMICONDUCTOR STRUCTURE AND METHOD FOR MANUFACTURING SAME

(71) Applicant: CHANGXIN MEMORY TECHNOLOGIES, INC., Hefei City (CN)

(72) Inventors: Honglei Chen, Hefei (CN); Hongwei Zhu, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 625 days.

(21) Appl. No.: 18/153,399

(22) Filed: Jan. 12, 2023

(65) Prior Publication Data

US 2024/0047370 A1 Feb. 8, 2024

(30) Foreign Application Priority Data

Aug. 5, 2022 (CN) .......................... 202210939050.0

(51) Int. Cl.
H01L 23/544 (2006.01)
H10B 12/00 (2023.01)

(52) U.S. Cl.
CPC ........... H01L 23/544 (2013.01); H10B 12/09 (2023.02); H10B 12/50 (2023.02); H01L 2223/54426 (2013.01)

(58) Field of Classification Search
CPC .. H10B 12/395; H10B 12/0383; H10B 12/50; H10B 41/27; H10B 43/27; H10B 43/50;

H10B 41/50; H10B 41/41; H10B 41/35; H10B 43/35; H10B 43/40; G11C 11/005; G11C 16/0483; H01L 21/78; H01L 23/544
See application file for complete search history.

(56) References Cited

U.S. PATENT DOCUMENTS

| | | | | |
|---|---|---|---|---|
| 9,691,782 B1 * | 6/2017 | Hwang | ............... | H10D 89/811 |
| 9,748,257 B2 * | 8/2017 | Lee | ......................... | H10B 43/50 |
| 2016/0322381 A1 * | 11/2016 | Liu | ........................ | H10D 64/035 |
| 2017/0062455 A1 * | 3/2017 | Nomura | ................. | H10B 43/27 |
| 2020/0303394 A1 * | 9/2020 | Hung | ..................... | H10B 41/50 |
| 2021/0028058 A1 * | 1/2021 | Kim | .................. | H01L 21/76877 |
| 2022/0216397 A1 * | 7/2022 | Wang | ..................... | H10B 61/00 |
| 2022/0299887 A1 * | 9/2022 | Han | ........................ | H01L 23/544 |
| 2024/0047370 A1 * | 2/2024 | Chen | .................... | H10B 12/482 |

FOREIGN PATENT DOCUMENTS

KR       20100129544 A  * 12/2010   ....... H01L 21/32139

* cited by examiner

*Primary Examiner* — Edward Chin
(74) *Attorney, Agent, or Firm* — Syncoda LLC; Feng Ma

(57) ABSTRACT
Embodiments of the disclosure provide a semiconductor structure and a method for manufacturing the same. The method includes the following operations. A substrate is provided, in which the substrate includes a device region and an alignment region. A layer stack covering the device region and the alignment region is formed on the substrate, in which the layer stack at least includes a first conductive layer as a bottom layer of the layer stack, and a material of the first conductive layer includes a semiconductor material. The layer stack is etched to respectively form first trenches in the device region and second trenches in the alignment region which penetrate through the layer stack, in which the second trenches and the layer stack located between the second trenches form alignment marks.

9 Claims, 11 Drawing Sheets

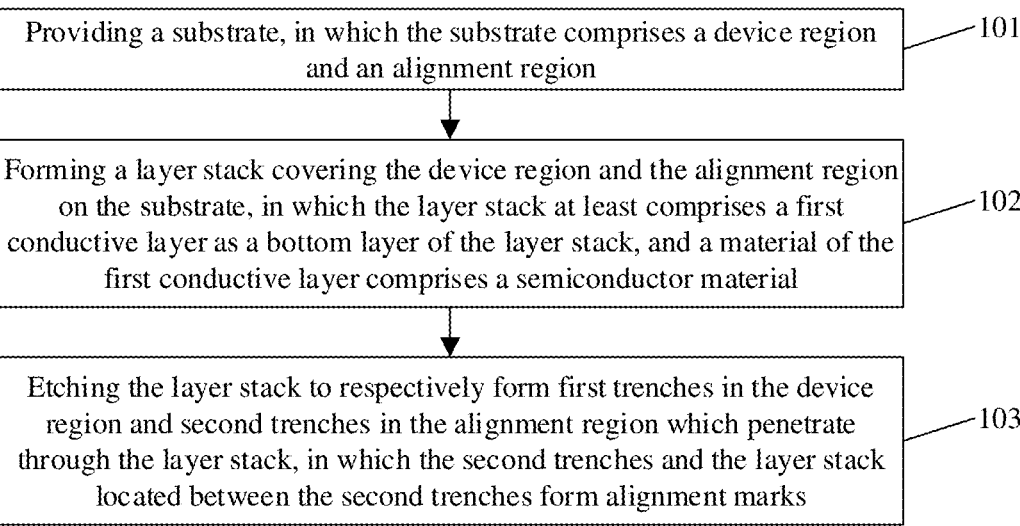

| Providing a substrate, in which the substrate comprises a device region and an alignment region | 101 |

| Forming a layer stack covering the device region and the alignment region on the substrate, in which the layer stack at least comprises a first conductive layer as a bottom layer of the layer stack, and a material of the first conductive layer comprises a semiconductor material | 102 |

| Etching the layer stack to respectively form first trenches in the device region and second trenches in the alignment region which penetrate through the layer stack, in which the second trenches and the layer stack located between the second trenches form alignment marks | 103 |

FIG. 1

SEMICONDUCTOR STRUCTURE AND METHOD FOR MANUFACTURING SAME

CROSS-REFERENCE TO RELATED APPLICATION

The present application claims benefit of Chinese Application No. 202210939050.0, filed on Aug. 5, 2022, the contents of which are hereby incorporated by reference in its entirety.

BACKGROUND

A semiconductor structure (for example, a dynamic random access memory) usually includes a device region and an alignment region. During manufacturing the semiconductor structure, alignment marks in the alignment region are usually used for controlling the alignment to achieve the alignment between device structures formed in the device region.

In the process of alignment, light beams are usually used for detecting the alignment marks. The light beams diffract at the alignment marks. The diffracted light is imaged on an image sensor of an alignment mark detection system, and then an image received by the image sensor is processed to identify the alignment marks.

However, when detecting alignment signals, there are usually problems that an intensity of the diffracted light is not high, and an accuracy of the identification of the alignment marks is poor, thus affecting a measurement and compensation of overlay (OVL).

SUMMARY

Embodiments of the disclosure provide a method for manufacturing a semiconductor structure, which includes the following operations.

A substrate is provided, in which the substrate includes a device region and an alignment region.

A layer stack covering the device region and the alignment region is formed on the substrate, in which the layer stack at least includes a first conductive layer as a bottom layer of the layer stack, and a material of the first conductive layer includes a semiconductor material.

The layer stack is etched to respectively form first trenches in the device region and second trenches in the alignment region which penetrate through the layer stack, in which the second trenches and the etched layer stack in the alignment region form alignment marks.

The disclosure further provides a semiconductor structure, which includes a substrate, a layer stack, first trenches and second trenches.

The substrate includes a device region and an alignment region.

The layer stack is located on the substrate, in which the layer stack at least includes a first conductive layer as a bottom layer of the layer stack, and a material of the first conductive layer includes a semiconductor material.

The first trenches and the second trenches are located respectively in the device region and the alignment region, in which the first trenches and the second trenches are located in the layer stack and penetrate through the layer stack, and the second trenches and the etched layer stack in the alignment region form alignment marks.

Details of one or more embodiments of the disclosure are set forth in the following drawings and descriptions. Other features and advantages of the disclosure will become apparent from the drawings of the specification and the claims.

BRIEF DESCRIPTION OF THE DRAWINGS

In order to more clearly illustrate the technical solutions of the embodiments of the disclosure, the drawings used in the description of the embodiments will be briefly introduced herein below. Apparently, the drawings in the following description are some embodiments of this disclosure, and for an ordinary person skilled in the art, other drawings can be obtained according to these drawings without making creative efforts.

FIG. 1 is a flowchart of a method for manufacturing a semiconductor structure provided by an embodiment of the disclosure;

DETAILED DESCRIPTION

Figure 2:
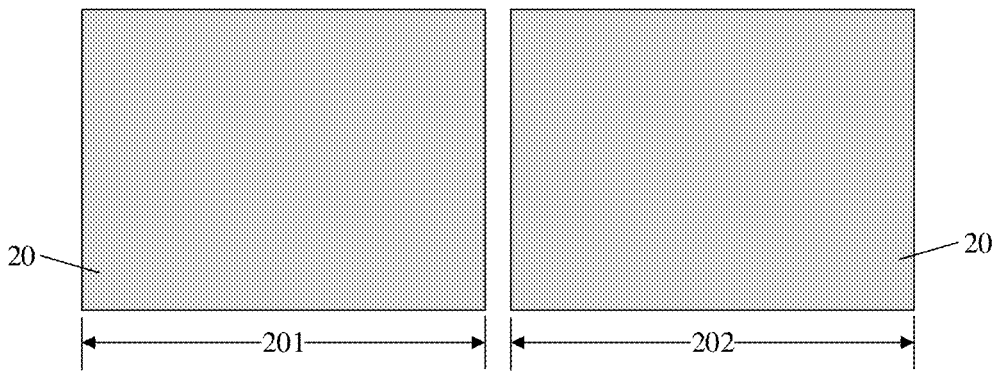
FIG. 2 to FIG. 9 are process flow diagrams of a method for manufacturing a semiconductor structure provided by an embodiment of the disclosure.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more fully understanding of the disclosure, and to completely convey a scope disclosed by the disclosure to a person skilled in the art.

In the following descriptions, a lot of specific details are given in order to provide the more fully understanding of the disclosure. However, it is apparent to a person skilled in the art that the disclosure may be implemented without one or more of these details. In other examples, in order to avoid confusion with the disclosure, some technical features well-known in the field are not described. Namely, not all of the features of an actual embodiments are described here, and well-known functions and structures are not described in detail.

In the drawings, the sizes of a layer, a region, and an element and their relative sizes may be magnified for clarity. The same reference sign represents the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

Spatial relation terms, such as "under . . . ", "below . . . ", "lower", "underneath . . . ", "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used here, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

A semiconductor structure (for example, a dynamic random access memory) usually includes a device region and an alignment region. During manufacturing the semiconductor structure, alignment marks in the alignment region are usually used for controlling the alignment to achieve the alignment between device structures formed in the device region. The alignment marks are usually a periodic pattern with bulges and grooves.

In the process of alignment, light beams are usually used for detecting the alignment marks. The light beams diffract at the alignment marks. The diffracted light is imaged on an image sensor of an alignment mark detection system, and then an image received by the image sensor is processed to identify the alignment marks.

However, when detecting alignment signals, there are usually problems that an intensity of the diffracted light is not high, and an accuracy of the identification of the alignment marks is poor, thus affecting an accuracy of measurement and compensation of overlay (OVL).

In view of the above, the following technical solutions of the embodiments of the disclosure are proposed.

An embodiment of the disclosure provides a method for manufacturing a semiconductor structure, referring to FIG. 1 for details. As shown in the figure, the method includes the following operations.

At 101, a substrate is provided, in which the substrate includes a device region and an alignment region.

At 102, a layer stack covering the device region and the alignment region is formed on the substrate. The layer stack at least includes a first conductive layer as a bottom layer of the layer stack. A material of the first conductive layer includes a semiconductor material.

At 103, the layer stack is etched to respectively form first trenches in the device region and second trenches in the alignment region which penetrate through the layer stack, in which the second trenches and the etched layer stack in the alignment region form alignment marks.

The embodiments of the disclosure will be described in detail below with reference to the accompanying drawings. When describing the embodiments of the disclosure in detail, for a convenience of description, schematic diagrams are partially enlarged not to scale, and are only examples, which should not be construed as limitations to the protection scope of the present disclosure.

The manufacturing method provided by the embodiments of the disclosure can be used for manufacturing a dynamic random access memory (DRAM). But it is not limited thereto, and the manufacturing method can be used for manufacturing any semiconductor structure.

FIG. 2 to FIG. 9 are process flow diagrams of a method for manufacturing a semiconductor structure provided by embodiments of the disclosure. The method for manufacturing a semiconductor structure provided by the embodiments of the disclosure is further described in detail with reference to FIG. 2 to FIG. 9.

First, step 101 is performed. As shown in FIG. 2, a substrate 20 is provided, in which the substrate 20 includes a device region 201 and an alignment region 202.

The substrate 20 may be a semiconductor substrate, and may include at least one elementary semiconductor material (for example, a silicon (Si) substrate, a germanium (Ge) substrate), at least one group III-V compound semiconductor material, at least one group II-VI compound semiconductor material, at least one organic semiconductor material, or other semiconductor materials known in the art. In a specific embodiment, the substrate 20 is a silicon substrate, which may be doped or not be doped. In a practical process, the semiconductor structure is formed on a wafer, and the alignment region 202 is usually arranged on a scribe line of the wafer.

Figure 5:
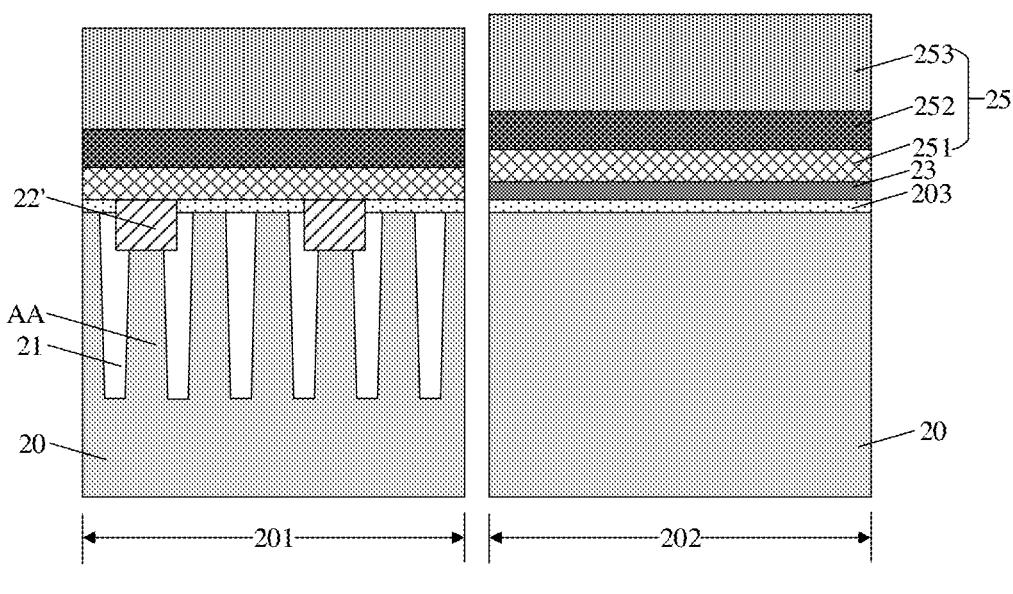

Next, step 102 is performed. As shown in FIG. 5, a layer stack 25 covering the device region 201 and the alignment region 202 is formed on the substrate 20. The layer stack 25 at least includes a first conductive layer 251 as a bottom layer of the layer stack. A material of the first conductive layer 251 includes a semiconductor material.

Figure 3:
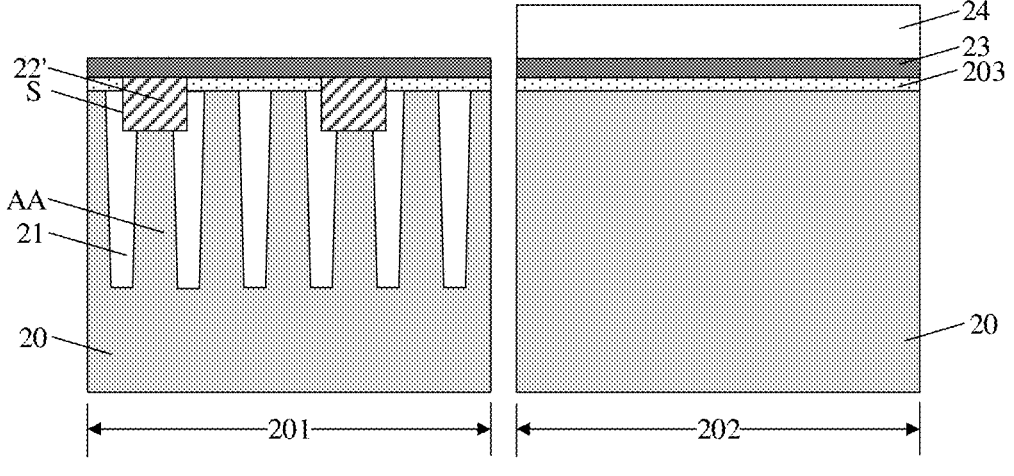
Figure 4:
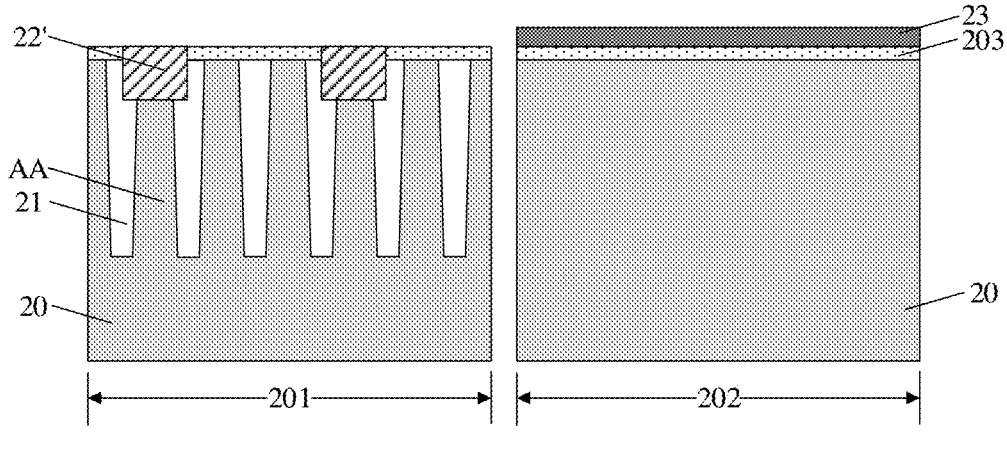

As shown in FIG. 3 to FIG. 4, in an embodiment, before forming a layer stack 25 on a substrate 20, the method further includes the following operations.

A first dielectric layer 23 is formed on the substrate 20.

A first mask pattern 24 is formed on the first dielectric layer 23, in which the first mask pattern 24 covers the alignment region 202.

The first dielectric layer 23 located in the device region 201 is removed with the first mask pattern 24 as a mask.

According to the embodiments of the disclosure, the first dielectric layer 23 is formed on the alignment region 202, so that the first dielectric layer 23 is exposed by second trenches T2 (referring to FIG. 7) to be formed subsequently. In this way, the intensity of the diffracted light is further enhanced, improving the alignment quality of the alignment marks and the accuracy of the identification of the alignment marks. A process for forming the first dielectric layer 23 includes, but is not limited to, a chemical vapor deposition (CVD) process, a plasma enhanced chemical vapor deposition (PECVD) process, an atomic layer deposition (ALD) process, or a combination thereof. A material of the first dielectric layer 23 may be a nitride, for example, silicon nitride. A material of the first mask pattern 24 may be a photoresist.

Still referring to FIG. 3, in an embodiment, the method further includes the following operations before forming the first dielectric layer 23 on the substrate 20.

An isolation structure 21 is formed in the substrate 20 of the device region 201, in which the isolation structure 21 separates the substrate 20 into multiple active areas AA.

Part of an active area AA and part of the isolation structure 21 covering sidewalls of the part of the active area AA are removed to form a groove S exposing a retained part of the active area AA below the removed part of the active area.

A conductive material is filled in the grooves S to form a contact plug material layer 22'.

In an embodiment, the method further includes forming an insulating layer 203 on the substrate 20, before removing at least the part of the active area AA and the part of the isolation structure 21 covering the sidewalls of the part of the active area AA to form the groove S exposing the retained part of the active area AA. The insulating layer 203 covers the device region 201 and the alignment region 202 to protect the substrate 20. In some embodiments, removing at least the part of the active area AA and the part of the isolation structure 21 covering the sidewalls of the part of the active area AA to form the groove S exposing the retained part of the active area AA includes the following operation. Part of the insulating layer 203, the part of the active area AA located under the part of the insulating layer 203 and the part of the isolation structure 21 which covers the sidewalls of the part of the active area AA are removed to form the groove S. A bottom of the groove S exposes a retained part of the active area AA. A material of the insulating layer 203 may be an oxide, for example, silicon oxide.

A material of the contact plug material layer 22' may include any suitable conductive material, for example, poly-silicon, silicon germanium, tungsten (W), copper (Cu), titanium (Ti), tantalum (Ta), titanium nitride (TiN), tantalum nitride (TaN), a metal silicide, a metal alloy or any combination thereof. The conductive material can be formed in the grooves S by a process of chemical vapor deposition (CVD), plasma enhanced CVD (PECVD), physical vapor deposition (PVD), atomic layer deposition (ALD), electroplating, chemical plating, sputtering or the like.

Still referring to FIG. 5, in an embodiment, forming the layer stack 25 on the substrate 20 includes the following operations.

The first conductive layer 251 is formed on the substrate 20, in which the first conductive layer 251 covers at least the contact plug material layer 22' and the first dielectric layer 23.

A second conductive layer 252 is formed on the first conductive layer 251.

A second dielectric layer 253 is formed on the second conductive layer 252.

Specifically, the first conductive layer 251 covers the insulating layer 203 and the contact plug material layer 22' located in the device region 201, and the first dielectric layer 23 located in the alignment region 202. The first conductive layer 251 is separated from the active areas AA by the insulating layer 203, but is in contact with the contact plug material layer 22'.

Here, the material of the first conductive layer 251 includes, but is not limited to, polysilicon, which may be doped or not doped. The material of the first conductive layer 251 may also be monocrystalline silicon, amorphous silicon, silicon germanium or other semiconductor materials. A process for forming the first conductive layer 251 includes, but is not limited to, a chemical vapor deposition (CVD) process, a plasma enhanced chemical vapor deposition (PECVD) process, an atomic layer deposition (ALD) process, or a combination thereof.

It should be noted that, in the figure, the second conductive layer 252 is shown as a single-layer, but the second conductive layer 252 may include multiple layers made of different materials. A material of the second conductive layer 252 may include tungsten (W), copper (Cu), titanium (Ti), tantalum (Ta), titanium nitride (TiN), tantalum nitride (TaN), a metal silicide, a metal alloy or any combination thereof. In a specific embodiment, the second conductive layer 252 includes a titanium layer, a titanium nitride layer on the titanium layer, and a tungsten layer on the titanium nitride layer. Each layer of the second conductive layer 252 may be formed by a process of chemical vapor deposition (CVD), plasma enhanced CVD (PECVD), physical vapor deposition (PVD), atomic layer deposition (ALD), electroplating, chemical plating, sputtering or the like. A material of the second dielectric layer 253 may include, but is not limited to, a nitride, for example, the nitride includes silicon nitride. A process for forming the second dielectric layer 253 includes, but is not limited to, a chemical vapor deposition (CVD) process, a plasma enhanced chemical vapor deposition (PECVD) process, an atomic layer deposition (ALD) process, or a combination thereof.

Figure 6:
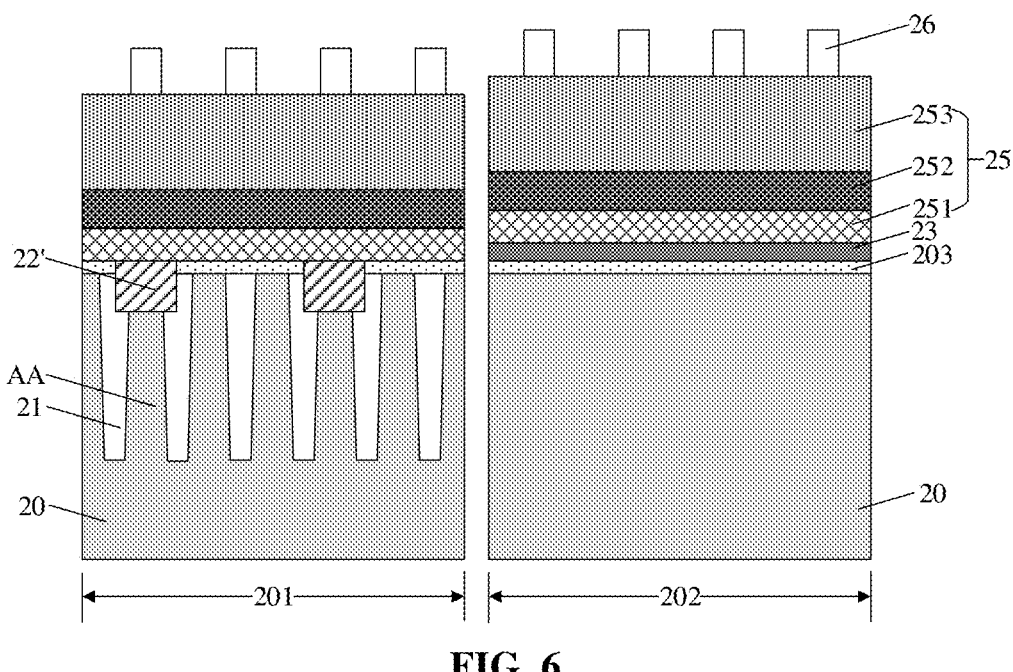
Figure 7:
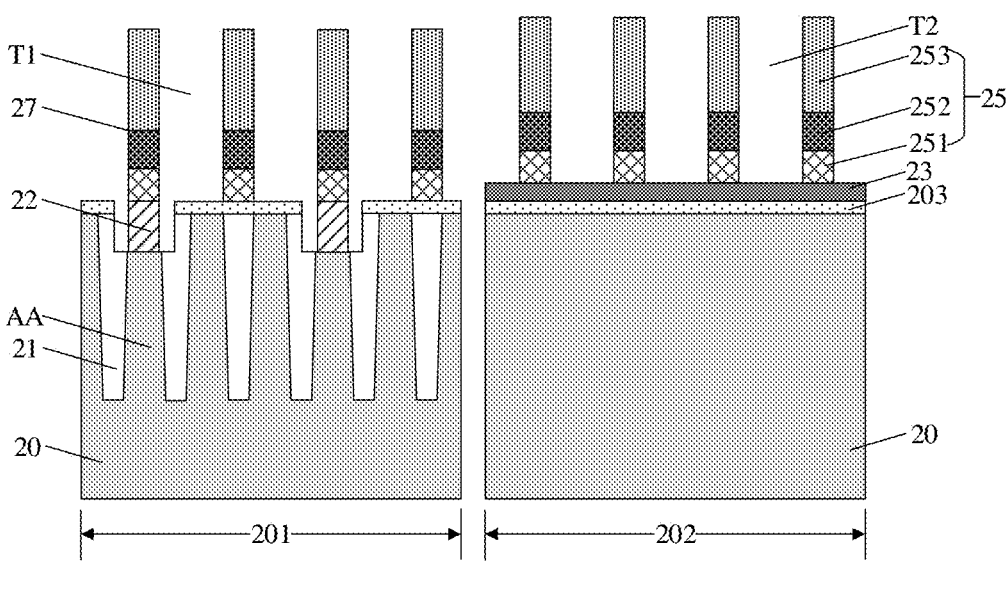

Next, step 103 is performed, as shown in FIG. 6 to FIG. 7, a layer stack 25 is etched to respectively form first trenches T1 in the device region 201 and second trenches T2 in the alignment region 202 which penetrate through the layer stack 25, in which the second trenches T2 and the etched layer stack 25 in the alignment region form alignment marks.

Specifically, etching the layer stack 25 to respectively form the first trenches T1 in the device region 201 and the second trenches T2 in the alignment region 202 which penetrate through the layer stack 25 includes the following operations.

A second mask pattern 26 is formed on the second dielectric layer 253.

The second dielectric layer 253, the second conductive layer 252, the first conductive layer 251 are etched from top to bottom with the second mask pattern 26 as a mask to respectively form the first trenches T1 in the device region 201 and the second trenches T2 in the alignment region 202. The first trenches T1 and the second trenches T2 divide the layer stack 25 into multiple discrete stacked structures 27. The first conductive layer 251 in the device region 201 covers part of the contact plug material layer 22'.

In the traditional process, operations for forming alignment marks in an alignment region are as follows. First, a first conductive layer is formed in a device region and the alignment region, in which the first conductive layer in the alignment region covers a first dielectric layer. Then, a photoresist layer covering the first conductive layer is formed in the device region, and the first conductive layer in the alignment region is removed with the photoresist layer as a mask. Then, a second conductive layer is formed on the first conductive layer in the device region and the first dielectric layer in the alignment region, and a second dielectric layer is formed on the second conductive layer. Then, the second dielectric layer, the second conductive layer and the first conductive layer are etched to respectively form first trenches in the device region and second trenches in the alignment region, in which the second trenches, and the second conductive layer and the second dielectric layer located between the second trenches form the alignment marks.

Compared with the traditional process, in the embodiments of the disclosure, an operation of removing the first conductive layer 251 in the alignment region 202 is omitted, so that the finally formed alignment marks include the second trenches T2 and the layer stack 25 located between the second trenches T2, in which the layer stack 25 includes the first conductive layer 251 as the bottom layer of the layer stack, and the material of the first conductive layer 251 includes polysilicon. In this way, the intensity of the diffracted light is enhanced, and the alignment quality of the alignment marks and the accuracy of the identification of the alignment marks are improved, thereby improving the accuracy of measurement and compensation of the overlay. The process operations are simplified at the same time. In addition, in the embodiments of the disclosure, the first trenches T1 and the second trenches T2 can be formed simultaneously with one etching process, which further simplifies the process.

During manufacturing the semiconductor structure, a wafer quality (WQ), a residual overlay performance indicator (ROPI) and other parameters are usually used to evaluate an alignment quality of alignment marks. Herein, the WQ is a percentage of an intensity of a measured signal of the alignment marks relative to an intensity of an ideal signal of the alignment marks. The higher the WQ is, the higher an intensity of the diffracted light is, and the higher the quality of the alignment marks is. The ROPI is a residual overlay after a correction is applied with an alignment model and/or process. The ROPI indicates an effectiveness of the correction. The less the ROPI is, the better effect of the correction is.

Figure 10A:
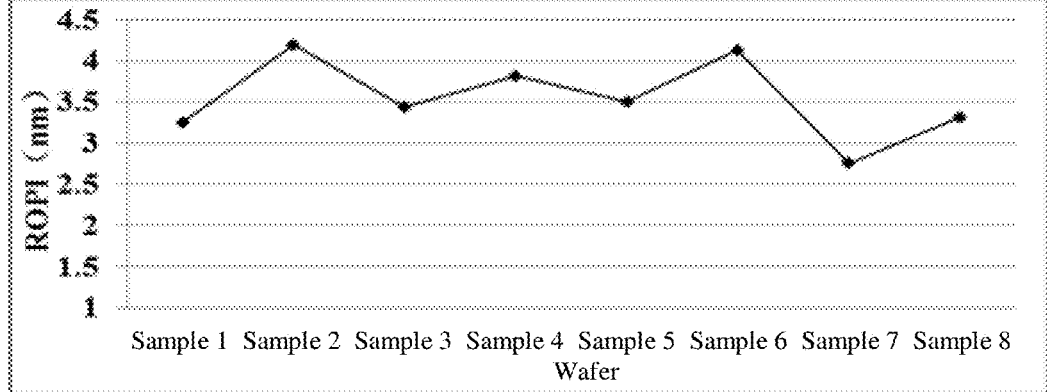
FIG. 10A to FIG. 10B are graphs showing ROPI values of alignment marks.
Figure 10B:
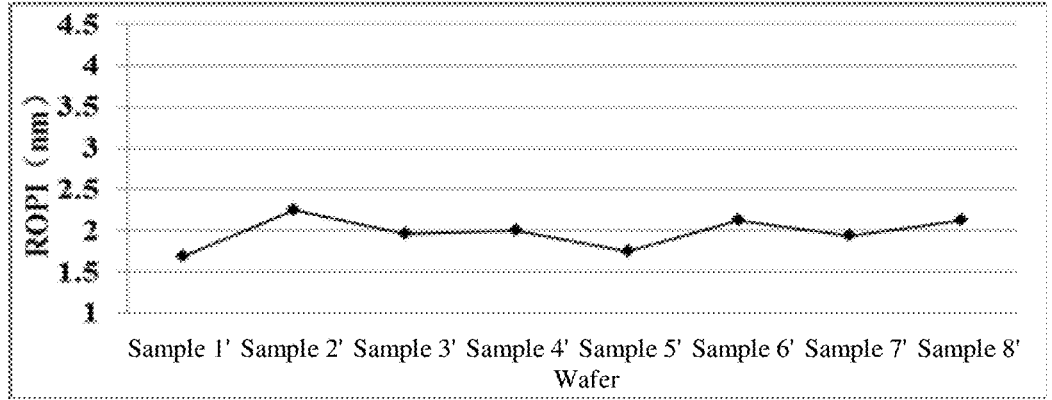

FIG. 10A to FIG. 10B are graphs showing ROPI values of alignment marks. Herein, FIG. 10A is a graph showing ROPI values of alignment marks without the first conductive layer 251 according to the traditional process, and FIG. 10B is a graph showing ROPI values of alignment marks provided by embodiments of the disclosure. FIG. 10A and FIG. 10B respectively show ROPI values of 8 wafer samples. It can be seen that, according to the embodiments of the disclosure, the ROPI values of the alignment marks are greatly reduced and are more stable, by retaining the first conductive layer 251 in the alignment region 202. In addition, according to the embodiments of the disclosure, a WQ of the alignment marks are also improved by retaining the first conductive layer 251. In some embodiments, the semiconductor structure is a dynamic random access memory, and the stacked structures 27 located in the device region 201 are bit lines.

Still referring to FIG. 7, after etching the layer stack 25 to respectively form the first trenches T1 in the device region 201 and the second trenches T2 in the alignment region 202 which penetrate the layer stack 25, the method further includes the following operation. The contact plug material layer 22' not covered by the first conductive layer 251 is removed to form contact plugs 22. In a practical process, the second dielectric layer 253, the second conductive layer 252, the first conductive layer 251 can be etched from top to bottom in the same manufacturing process to form the stacked structures 27, and then the contact plug material layer 22' is etched with the stacked structures 27 as a mask to form contact plugs 22.

Figure 8:
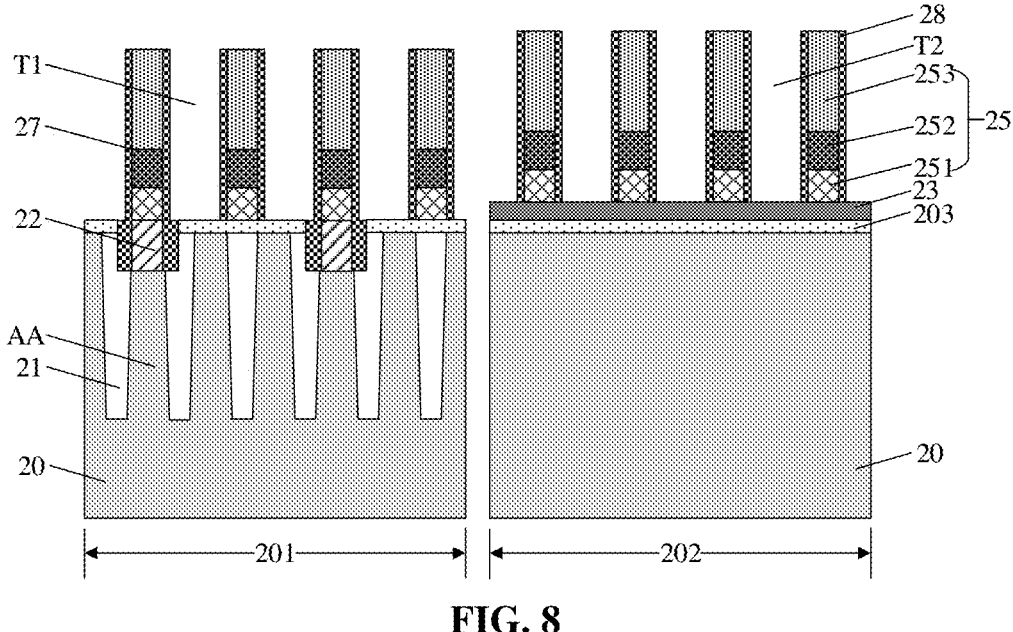

Next, as shown in FIG. 8, a third dielectric layer 28 covering sidewalls of the stacked structures 27 is formed, in which in the device region 201, the third dielectric layer 28 also fills interspaces at either side of a contact plug 22, and the interspaces are formed by removing part of the contact plug material layer 22'. A process for forming the third dielectric layer 28 includes, but is not limited to, a chemical vapor deposition (CVD) process, a plasma enhanced chemical vapor deposition (PECVD) process, an atomic layer deposition (ALD) process, or a combination thereof. It should be noted that, in the figure, the third dielectric layer 28 is shown as a single-layer, but the third dielectric layer 28 may also be multiple layers made of different materials, for example, one of a nitride, an oxide, a nitrogen oxide or the like, or any combination thereof.

Figure 9:
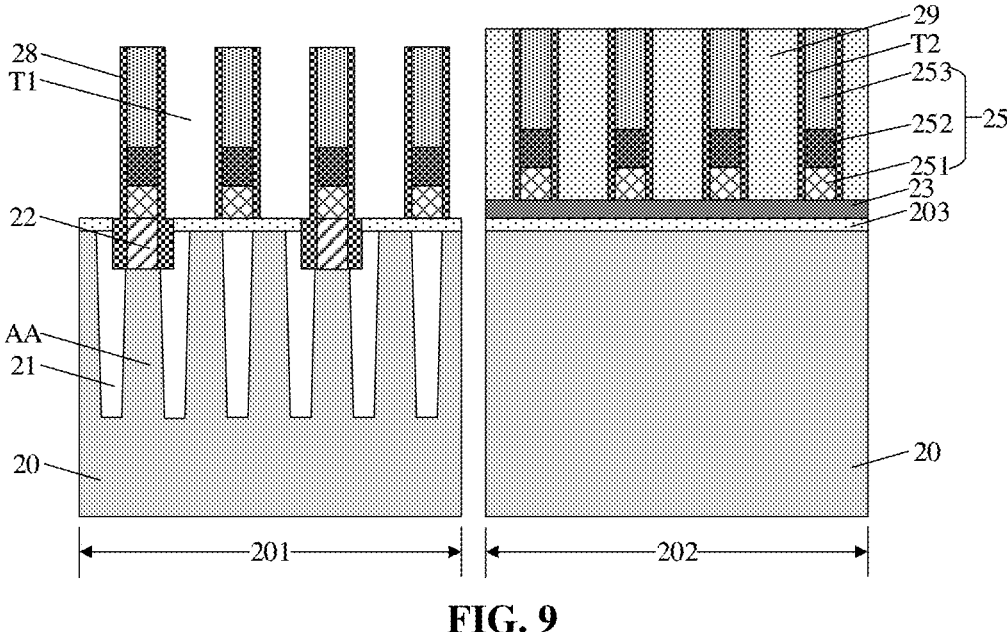

Next, as shown in FIG. 9, after forming the third dielectric layer 28, the method further includes the following operation. A fourth dielectric layer 29 is formed in the second trenches T2, in which the fourth dielectric layer 29 covers sidewalls of the third dielectric layer 28 and fills the second trenches T2. The fourth dielectric layer 29 may be formed in the second trenches T2 by a process of chemical vapor deposition (CVD), plasma enhanced chemical vapor deposition (PECVD), atomic layer deposition (ALD) or the like. A material of the fourth dielectric layer 29 may include, but is not limited to, an oxide, for example, the oxide includes silicon oxide.

In subsequent processes, multiple isolation fences can be formed in the device region. An extending direction of the isolation fences is perpendicular to an extending direction of the first trenches, and each of the first trenches is divided into multiple openings by the isolation fences. Then, part of the semiconductor structure at bottoms of the openings is removed to expose the active areas. Then, storage node contact plugs are formed in the openings, and the storage node contact plugs are electrically connected with the active areas.

It should be noted that, a person skilled in the art is able to make a feasible change of an order of the above operations without departing from the protection scope of the disclosure.

Embodiments of the disclosure further provide a semiconductor structure, as shown in FIG. 9, which includes: a substrate 20, in which the substrate 20 includes a device region 201 and an alignment region 202; a layer stack 25 located on the substrate 20, in which the layer stack 25 includes at least a first conductive layer 251 as a bottom layer of the layer stack, and a material of the first conductive layer 251 includes a semiconductor material; first trenches T1 in the device region 201 and second trenches T2 in the alignment region 202 which penetrate through the layer stack 25, in which the second trenches T2 and the etched layer stack 25 in the alignment region form alignment marks.

The substrate 20 may be a semiconductor substrate, and may include at least one elementary semiconductor material (for example, a silicon (Si) substrate, a germanium (Ge) substrate), at least one group III-V compound semiconductor material, at least one group II-VI compound semiconductor material, at least one organic semiconductor material, or other semiconductor materials known in the art. In a specific embodiment, the substrate 20 is a silicon substrate, which may be doped or not be doped. In a practical process, the semiconductor structure is formed on a wafer, and the alignment region 202 is usually arranged on a scribe line of the wafer.

In an embodiment, the material of the first conductive layer 251 includes polysilicon, which may be doped or not doped. But it is not limited to this, and the material of the first conductive layer 251 may also be monocrystalline silicon, amorphous silicon, silicon germanium or other semiconductor materials. A process for forming the first conductive layer 251 includes, but is not limited to, a chemical vapor deposition (CVD) process, a plasma enhanced chemical vapor deposition (PECVD) process, an atomic layer deposition (ALD) process, or a combination thereof.

In an embodiment, the layer stack 25 further includes a second conductive layer 252 located on the first conductive layer 251 and a second dielectric layer 253 located on the second conductive layer 252. It should be noted that, in the figure, the second conductive layer 252 is shown as a single-layer, but the second conductive layer 252 may include multiple layers made of different materials. A material of the second conductive layer 252 includes tungsten (W), copper (Cu), titanium (Ti), tantalum (Ta), titanium nitride (TiN), tantalum nitride (TaN), a metal silicide, a metal alloy or any combination thereof. In a specific embodiment, the second conductive layer 252 includes a titanium layer, a titanium nitride layer on the titanium layer, and a tungsten layer on the titanium nitride layer. Each layer of the second conductive layer 252 may be formed by a process of chemical vapor deposition (CVD), plasma enhanced CVD (PECVD), physical vapor deposition (PVD), atomic layer deposition (ALD), electroplating, chemical plating, sputtering or the like. A material of the second dielectric layer 253 may include, but is not limited to, a nitride, for example, the nitride includes silicon nitride. A process for forming the second dielectric layer 253 includes, but is not limited to, a chemical vapor deposition (CVD) process, a plasma enhanced chemical vapor deposition (PECVD) process, an atomic layer deposition (ALD) process, or a combination thereof.

In the traditional process, operations for forming alignment marks in an alignment region are as follows. First, a first conductive layer covering a device region and the alignment region is formed. Then, a photoresist layer covering the first conductive layer is formed in the device region, and the first conductive layer in the alignment region is removed with the photoresist layer as a mask. Then, a second conductive layer is formed on the first conductive layer in the device region and the first dielectric layer in the alignment region, and a second dielectric layer is formed on the second conductive layer. Then, the second dielectric layer, the second conductive layer and the first conductive layer are etched to respectively form first trenches in the device region and second trenches in the alignment region, in which the second trenches, and the second conductive layer and the second dielectric layer located between the second trenches form the alignment marks.

Compared with the traditional process, during forming the alignment marks in the alignment region 202 according to the disclosure, an operation of removing the first conductive layer 251 in the alignment region 202 is omitted, so that the finally formed alignment marks include the second trenches T2 and the layer stack 25 located between the second trenches T2, in which the layer stack 25 includes the first conductive layer 251 as the bottom layer of the layer stack, and the material of the first conductive layer 251 includes polysilicon. In this way, an intensity of diffracted light is enhanced, and an alignment quality of the alignment marks and an accuracy of identification of the alignment marks are improved, thereby improving an accuracy of measurement and compensation of the overlay. Process operations are simplified at the same time. In addition, in practical operations, the first trenches T1 and the second trenches T2 can be formed simultaneously with one etching process, which further simplifies a manufacturing process.

During manufacturing of the semiconductor structure, a wafer quality (WQ), a residual overlay performance indicator (ROPI) and other parameters are usually used to evaluate an alignment quality of alignment marks. Herein, the WQ is a percentage of an intensity of a measured signal of the alignment marks relative to an intensity of an ideal signal of the alignment marks. The higher the WQ is, the higher an intensity of the diffracted light is, and the higher the quality of the alignment marks is. The ROPI is a residual overlay after correction is applied with an alignment model and/or process. The ROPI indicates an effectiveness of the correction. The less the ROPI is, the better the effect of the correction is.

FIG. 10A to FIG. 10B are graphs showing ROPI values of alignment marks. Herein, FIG. 10A is a graph showing ROPI values of alignment marks without the first conductive layer 251 according to the traditional process, and FIG. 10B is a graph showing ROPI values of alignment marks provided by embodiments of the disclosure. FIG. 10A and FIG. 10B respectively show ROPI values of 8 wafer samples. It can be seen that, according to the embodiments of the disclosure, the ROPI values of the alignment marks are reduced and are more stable, by retaining the first conductive layer 251 in the alignment region 202. In addition, according to the embodiments of the disclosure, the WQ of the alignment marks are also improved by retaining the first conductive layer 251.

In an embodiment, the semiconductor structure further includes a first dielectric layer 23. The first dielectric layer 23 is located under the layer stack 25 of the alignment region 202 and covers the alignment region 202. The first dielectric layer 23 is exposed by the second trenches T2 in the alignment region 202. In this way, the intensity of the diffracted light is further enhanced, improving the alignment quality of the alignment marks and the accuracy of the identification of the alignment marks. A material of the first dielectric layer 23 may be a nitride, for example, silicon nitride. The first dielectric layer 23 may be formed by a chemical vapor deposition (CVD) process, a plasma enhanced chemical vapor deposition (PECVD) process, an atomic layer deposition (ALD) process, or a combination thereof.

The first trenches T1 and the second trenches T2 divide the layer stack 25 into multiple discrete stacked structures 27. The semiconductor structure provided by the embodiments of the disclosure is a dynamic random access memory, and the stacked structures 27 located in the device region 201 may be bit lines.

In an embodiment, the semiconductor structure further includes: an isolation structure 21 located in the device region 201, in which the isolation structure 21 is located in the substrate 20 and defines multiple active areas AA in the substrate 20; and contact plugs 22 located in the device region 201, in which at least part of each of the contact plugs 22 is located in the substrate 20 and each of the contact plugs covers part of an active area AA. In a specific embodiment, the first conductive layer 251 located in the device region 201 is in contact with the contact plugs 22.

A material of the contact plugs 22 may include any suitable conductive material, for example, polysilicon, silicon germanium, tungsten (W), copper (Cu), titanium (Ti), tantalum (Ta), titanium nitride (TiN), tantalum nitride (TaN), a metal silicide, a metal alloy or any combination thereof. The contact plugs 22 may be formed by a process of chemical vapor deposition (CVD), plasma enhanced CVD (PECVD), physical vapor deposition (PVD), atomic layer deposition (ALD), electroplating, chemical plating, sputtering or the like.

In some embodiments, the semiconductor structure further includes: an insulating layer 203 located a top surface of the substrate 20, in which the insulating layer 203 covers the alignment region 202 as well as the isolation structure 21 and the active areas AA in the device region 201. Herein, the first dielectric layer 23 covers the insulating layer 203 located in the alignment region 202; and the first conductive layer 251 located in the device region 201 also covers part of the insulating layer 203. The insulating layer 203 is used for separating the first conductive layer 251 from the active areas AA. Part of each of the contact plugs 22 is located in the insulating layer 203, and top surfaces of the contact plugs 22 are flush with a top surface of the insulating layer 203. A material of the insulating layer 203 may be an oxide, for example, silicon oxide.

In an embodiment, the semiconductor structure further includes a third dielectric layer 28. The third dielectric layer 28 at least covers sidewalls of the stacked structures 27. In some embodiment, the third dielectric layer 28 is further provided between the contact plugs 22 and the isolation structure 21. A process for forming the third dielectric layer 28 includes, but is not limited to, a chemical vapor deposition (CVD) process, a plasma enhanced chemical vapor deposition (PECVD) process, an atomic layer deposition (ALD) process, or a combination thereof. It should be noted that, in the figure, the third dielectric layer 28 is shown as a single-layer, but the third dielectric layer 28 may also be multiple layers made of different materials, for example, one of a nitride, an oxide, a nitrogen oxide or the like, or any combination thereof.

In an embodiment, the semiconductor structure further includes: a fourth dielectric layer 29 located in the second trenches T2, in which the fourth dielectric layer 29 covers sidewalls of the third dielectric layer 28 and fills the second trenches T2. A material of the fourth dielectric layer 29 may include, but is not limited to, an oxide, for example, the oxide includes silicon oxide.

In practical operations, multiple isolation fences can be subsequently formed in the device region. An extending direction of the isolation fences is perpendicular to an extending direction of the first trenches, and each of the first trenches is divided into multiple openings by the isolation fences. Then, part of the semiconductor structure at bottoms of the openings is removed to expose the active areas. Then, storage node contact plugs are formed in the openings, and the storage node contact plugs are electrically connected with the active areas.

It should be noted that, the above merely describes optional embodiments of the disclosure, and is not intended to limit the protection scope of the disclosure. Any modification, equivalent replacement and improvement made with the spirit and principles of the disclosure shall be included in the protection scope of the disclosure.

The invention claimed is:

1. A method for manufacturing a semiconductor structure, comprising:

providing a substrate, wherein the substrate comprises a device region and an alignment region;

forming a layer stack covering the device region and the alignment region on the substrate, wherein the layer stack at least comprises a first conductive layer as a bottom layer of the layer stack, and a material of the first conductive layer comprises a semiconductor material; and etching the layer stack to respectively form first trenches in the device region and second trenches in the alignment region which penetrate through the layer stack, wherein the first trenches and the second trenches divide the layer stack into multiple discrete stacked structures, wherein the second trenches and the discrete stacked structures in the alignment region form alignment marks, wherein portions, located in the discrete stacked structures in the alignment region, of the first conductive layer, are disconnected from each other.

2. The method according to claim 1, wherein the material of the first conductive layer comprises polysilicon.

3. The method according to claim 1, wherein the method further comprises: before forming the layer stack on the substrate, forming a first dielectric layer on the substrate;

forming a first mask pattern on the first dielectric layer, wherein the first mask pattern covers the alignment region; and removing the first dielectric layer in the device region with the first mask pattern as a mask.

4. The method according to claim 3, wherein the method further comprises: before forming the first dielectric layer on the substrate, forming an isolation structure in the substrate of the device region, wherein the isolation structure separates the substrate into multiple active areas;

removing part of an active area and part of the isolation structure covering sidewalls of the part of the active area to form a groove which exposes a retained part of the active area below the removed part of the active area; and filling a conductive material in the groove to form a contact plug material layer.

5. The method according to claim 4, wherein forming the layer stack on the substrate comprises:

forming the first conductive layer on the substrate, wherein the first conductive layer covers at least the contact plug material layer and the first dielectric layer;

forming a second conductive layer on the first conductive layer; and forming a second dielectric layer on the second conductive layer.

6. The method according to claim 5, wherein etching the layer stack to respectively form the first trenches in the device region and the second trenches in the alignment region which penetrate through the layer stack comprises:

forming a second mask pattern on the second dielectric layer, and etching the second dielectric layer, the second conductive layer, the first conductive layer from top to bottom with the second mask pattern as a mask to respectively form the first trenches in the device region and the second trenches in the alignment region, wherein the first conductive layer located in the device region covers part of the contact plug material layer.

7. The method according to claim 6, wherein the method further comprises: after etching the layer stack to respectively form the first trenches in the device region and the second trenches in the alignment region which penetrate through the layer stack, removing the contact plug material layer not covered by the first conductive layer to form a contact plug.

8. The method according to claim 7, wherein the method further comprises:

forming a third dielectric layer covering sidewalls of the stacked structures, wherein in the device region, the third dielectric layer further fills interspaces at either side of the contact plug, and wherein the interspaces are formed by removing part of the contact plug material layer.

9. The method according to claim 8, wherein the method further comprises: after forming the third dielectric layer, forming a fourth dielectric layer in the second trenches, wherein the fourth dielectric layer covers sidewalls of the third dielectric layer and fills the second trenches.

\* \* \* \* \*